United States Patent
Khoo et al.

(10) Patent No.: US 10,041,973 B2
(45) Date of Patent: Aug. 7, 2018

(54) METHOD AND APPARATUS FOR DYNAMIC ALIGNMENT OF SEMICONDUCTOR DEVICES

(71) Applicant: Infineon Technologies AG, Neubiberg (DE)

(72) Inventors: Nee Wan Khoo, Melaka (MY); Horst Groeninger, Maxhütte-haidhof (DE)

(73) Assignee: Infineon Technologies AG, Neubiberg (DE)

( * ) Notice: Subject to any disclaimer, the term of this patent is extended or adjusted under 35 U.S.C. 154(b) by 1144 days.

(21) Appl. No.: 14/017,358

(22) Filed: Sep. 4, 2013

(65) Prior Publication Data

US 2015/0063969 A1    Mar. 5, 2015

(51) Int. Cl.
*H01L 21/68* (2006.01)
*G01R 1/04* (2006.01)
*H01L 23/00* (2006.01)

(52) U.S. Cl.
CPC ......... G01R 1/0466 (2013.01); G01R 1/0483 (2013.01); *H01L 24/75* (2013.01); *H01L 2224/75704* (2013.01)

(58) Field of Classification Search
CPC .............. H01L 21/68; H01L 21/68728; H01L 21/68721; H01L 21/68771; H01L 21/67333; H01L 21/68778; H01L 2224/78703; H01L 21/673; H01L 2224/683; H01L 2224/75704; H01L 24/75; B25B 5/06; B25B 1/06; B25B 1/00; B25B 5/00; B25B 7/00; B23Q 3/104; G01R 1/0466

(Continued)

(56) References Cited

U.S. PATENT DOCUMENTS 3,466,514 A * 9/1969 Brunner .............. B23Q 1/4866
                                                  219/158
4,345,810 A * 8/1982 Bakermans .......... H05K 7/1069
                                                  439/331

(Continued)

FOREIGN PATENT DOCUMENTS

CN    101765784 A    6/2010
CN    201868406 U    6/2011

(Continued)

OTHER PUBLICATIONS

"Separate." Merriam-Webster, Merriam-Webster, www.merriam-webster.com/dictionary/separate. accessed Nov. 26, 2017.*

*Primary Examiner* — Joseph J Hail
*Assistant Examiner* — Arman Milanian
(74) *Attorney, Agent, or Firm* — Murphy, Bilak & Homiller, PLLC

(57) ABSTRACT

A semiconductor device is aligned by placing the semiconductor device in a nest between first and second sections of the nest when the nest is in a receiving position in which the first and second sections are spaced further apart from one another than when the nest is in an aligning position. The nest is moved from the receiving position to the aligning position with the semiconductor device in the nest so that the first and second sections are spaced closer to one another and align the semiconductor device in the nest. The semiconductor device is removed from the nest after the semiconductor device is aligned.

18 Claims, 9 Drawing Sheets

(58) Field of Classification Search
USPC ....... 269/296, 254 R, 156, 291, 299, 43, 45;
206/480, 701, 706; 29/271, 759, 559;
324/762.02; 414/754, 783, 816
See application file for complete search history.

(56) References Cited

U.S. PATENT DOCUMENTS

| | | | | |
|---|---|---|---|---|
| 4,681,221 A * | 7/1987 | Chickanosky | ....... | H05K 13/021 206/486 |
| 4,747,483 A * | 5/1988 | Grabbe | ............. | H05K 7/10 206/724 |
| 4,784,377 A * | 11/1988 | Woodward | ............ | B25B 11/005 269/21 |
| 4,948,330 A * | 8/1990 | Nomura | ............ | G03F 7/70725 269/73 |
| 5,320,550 A * | 6/1994 | Uratsuji | ............. | H05K 7/1061 439/266 |
| 5,329,227 A * | 7/1994 | Sinclair | ............. | G01R 1/0433 324/756.02 |
| 5,494,169 A * | 2/1996 | Matsuoka | ........... | H05K 13/021 206/480 |
| 5,742,487 A * | 4/1998 | Kobayashi | ............. | B25J 15/04 206/560 |
| 5,873,566 A * | 2/1999 | Cadwallader | ........... | B23Q 3/18 269/228 |
| 5,901,829 A * | 5/1999 | Ito | ............. | G01R 31/2887 198/345.1 |
| 5,905,566 A * | 5/1999 | Comulada | ............. | H02N 13/00 355/53 |
| 6,128,074 A * | 10/2000 | Hong | ............. | H01L 22/12 257/E21.53 |
| 6,145,651 A * | 11/2000 | Torihata | ............. | B23K 20/004 193/15 |
| 6,446,951 B2 * | 9/2002 | Nuxoll | ............. | B65H 9/101 269/118 |
| 6,514,097 B1 * | 2/2003 | Conroy | ............. | G01R 1/0466 439/330 |
| 6,814,602 B1 * | 11/2004 | Gattuso | ............. | G01R 1/0466 439/331 |
| 7,422,202 B2 * | 9/2008 | Wu | ............. | G02B 27/62 269/291 |
| 7,726,540 B2 * | 6/2010 | Cheng | ............. | B23K 3/087 228/212 |
| 7,971,863 B2 * | 7/2011 | Chen | ............. | B25B 5/06 269/289 R |
| 8,523,163 B2 * | 9/2013 | Na | ............. | G01R 1/0466 206/724 |
| 9,024,649 B2 * | 5/2015 | Choi | ............. | G01R 1/0466 324/750.16 |
| 2002/0070144 A1 * | 6/2002 | Shim | ............. | G01R 1/04 206/706 |
| 2002/0115315 A1 * | 8/2002 | Clayton | ............. | G01R 1/0433 439/70 |
| 2003/0049953 A1 * | 3/2003 | Sausen | ............. | G01R 1/0466 439/73 |
| 2004/0248435 A1 * | 12/2004 | Sato | ............. | G01R 1/0466 439/73 |
| 2005/0126028 A1 * | 6/2005 | Lim | ............. | G02F 1/1333 33/645 |
| 2006/0071656 A1 * | 4/2006 | Joung | ............. | G01R 1/0466 324/757.01 |
| 2006/0110953 A1 * | 5/2006 | Allsup | ............. | G01R 1/0466 439/71 |
| 2006/0154386 A1 * | 7/2006 | Cheng | ............. | G01R 1/045 438/15 |
| 2007/0285106 A1 * | 12/2007 | Henry | ............. | G01R 1/0408 324/555 |
| 2010/0164482 A1 * | 7/2010 | Potzinger | ............. | G01R 1/0466 324/762.02 |
| 2010/0230885 A1 * | 9/2010 | Di Stefano | ............. | G01R 31/2867 269/303 |
| 2011/0006183 A1 * | 1/2011 | Hofmann | ............. | G01R 1/0425 248/346.04 |
| 2011/0041311 A1 * | 2/2011 | Hofmann | ............. | G01R 1/0425 29/464 |
| 2011/0042265 A1 * | 2/2011 | Hofmann | ............. | G01R 1/0425 206/701 |
| 2011/0043982 A1 * | 2/2011 | Poetzinger | ............. | G01R 1/0425 361/679.01 |
| 2011/0074080 A1 * | 3/2011 | Di Stefano | ............. | H01L 21/67333 269/56 |
| 2011/0074458 A1 * | 3/2011 | Di Stefano | ............. | G01R 1/0466 324/757.01 |
| 2011/0201221 A1 * | 8/2011 | Kobayashi | ............. | H05K 7/1061 439/331 |
| 2012/0137512 A1 * | 6/2012 | Di Stefano | ............. | G01R 31/2867 29/825 |
| 2012/0139176 A1 * | 6/2012 | Di Stefano | ............. | B25B 5/06 269/287 |

FOREIGN PATENT DOCUMENTS

| | | | |
|---|---|---|---|
| GB | 2337360 A | | 11/1999 |
| JP | H04174988 | * | 6/1992 |
| KR | 20010077104 A | | 8/2001 |

* cited by examiner

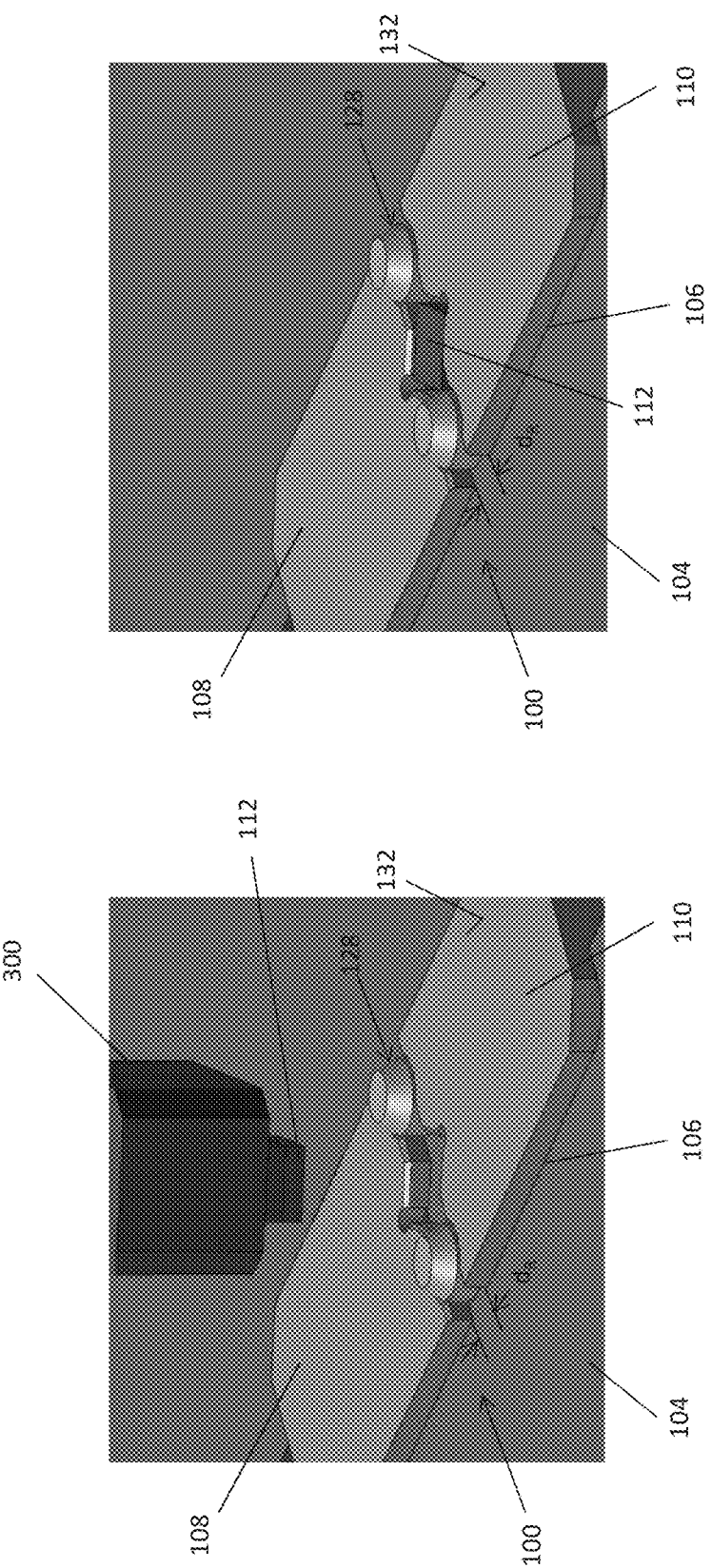

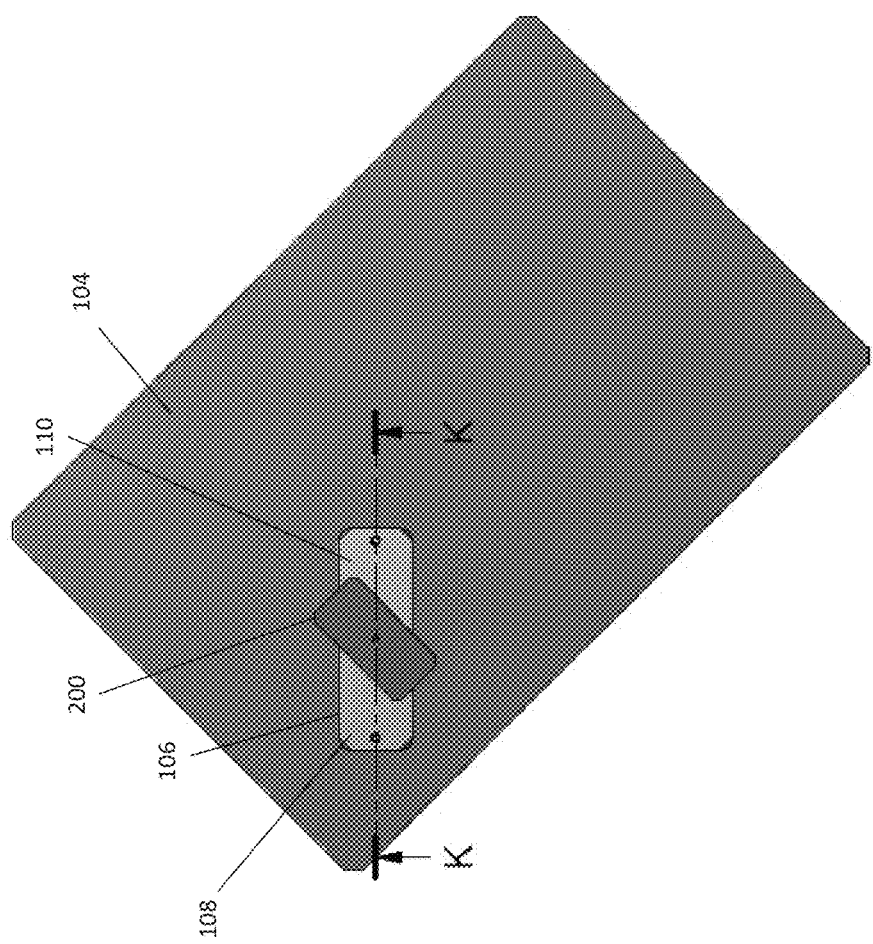

METHOD AND APPARATUS FOR DYNAMIC ALIGNMENT OF SEMICONDUCTOR DEVICES

TECHNICAL FIELD

The present application relates to handling of semiconductor packages, in particular to alignment of semiconductor packages during handling.

BACKGROUND

Semiconductor devices such as packages and dies must be handled for various purposes such as transport between equipment, testing, etc. In each case, one or more semiconductor devices are seated in a receptacle of a plate or other structure such as a device carrier (or so-called shuttle), test socket, etc. The devices must be aligned properly within the receptacles in which the devices are seated. Otherwise, subsequent handling of the devices will not be successful. For example, an unaligned device may not be tested accurately or properly removed from a device carrier such as a shuttle. While semiconductor device dimensions continue to shrink, device tolerance remains relatively large.

Static alignment techniques for seating a semiconductor device in a receptacle have no means for making alignment adjustments after device seating, and therefore are impractical solutions for semiconductor devices with relatively small dimensions. Dynamic alignment techniques can accommodate semiconductor devices with relatively small dimensions, but use both vision inspection and mechanical alignment. Conventional dynamic alignment techniques require massive hardware integration of cameras and alignment motors. Typically each device alignment requires three motors to move in X, Y and Theta directions. For the case of 8× or higher parallel testing, multiple sets of cameras and alignment motors are required. Such additional equipment not only significantly increases cost, but also reduces device throughput as measured in units per hour (UPH).

SUMMARY

According to an embodiment of an apparatus, the apparatus comprises a nest and an actuator. The nest comprises a first section and a second section. The nest is configured to receive a semiconductor device in a receiving position in which the first and second sections are spaced apart from one another by a first distance, and to align the semiconductor device in an aligning position in which the first and second sections are spaced apart from one another by a second distance less than the first distance. The actuator is configured to move the nest from the receiving position to the aligning position.

According to an embodiment of a method of aligning a semiconductor device, the method comprises: placing a semiconductor device in a nest between first and second sections of the nest when the nest is in a receiving position in which the first and second sections are spaced further apart from one another than when the nest is in an aligning position; moving the nest from the receiving position to the aligning position with the semiconductor device in the nest so that the first and second sections are spaced closer to one another and align the semiconductor device in the nest; and removing the semiconductor device from the nest after the semiconductor device is aligned.

According to another embodiment of an apparatus, the apparatus comprises a nest, an actuator and a plunger. The nest comprises a first section and a second section. The nest is configured to receive a semiconductor device in a receiving position in which the first and second sections are spaced apart from one another by a first distance, and to align the semiconductor device in an aligning position in which the first and second sections are spaced apart from one another by a second distance less than the first distance. The actuator is configured to move the nest from the receiving position to the aligning position. The plunger is moveable in a direction perpendicular to a main surface of the first and second sections of the nest so that the plunger can place a semiconductor device in the nest for alignment and remove the semiconductor device from the nest after alignment.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 3, which includes FIGS. 3A through 3F, illustrates a perspective view of the apparatus of FIG. 1 during different stages of an embodiment of a method of aligning a semiconductor device within the nest of the apparatus.

FIG. 4, which includes FIGS. 4A and 4B, illustrates different views of an apparatus comprising a nest for holding a semiconductor device and an actuator for moving the nest from a device receiving position to a device aligning position, according to another embodiment.

FIG. 5, which includes

DETAILED DESCRIPTION

The embodiments described herein provide dynamic alignment of semiconductor devices seated in receptacles of a plate or other structure such as a device carrier (or so-called shuttle) for transporting semiconductor devices, a test socket for testing semiconductor devices, etc. The dynamic alignment techniques described herein provide accurate and consistent device positioning, e.g. improving the position repeatability of lead pads of semiconductor packages for test contacting despite wide package tolerances. To this end, a vertical force is used to dynamically align a semiconductor device seated in a nest. In one embodiment a plunger is used to actuate alignment of a semiconductor device seated in the nest during a vertical down-stroke motion which causes opposing sections of the nest to close and contact the sides of the device, aligning the device within the nest. During the following return upstroke, the vertical movement of the plunger causes the sections of the nest to move further apart from one another so that the device can be removed from the nest by the plunger. The dynamic alignments techniques described herein can be used with any standard device handling equipment e.g. in a pre-alignment plate (shuttle), as part of a test socket, etc.

Figure 1A:
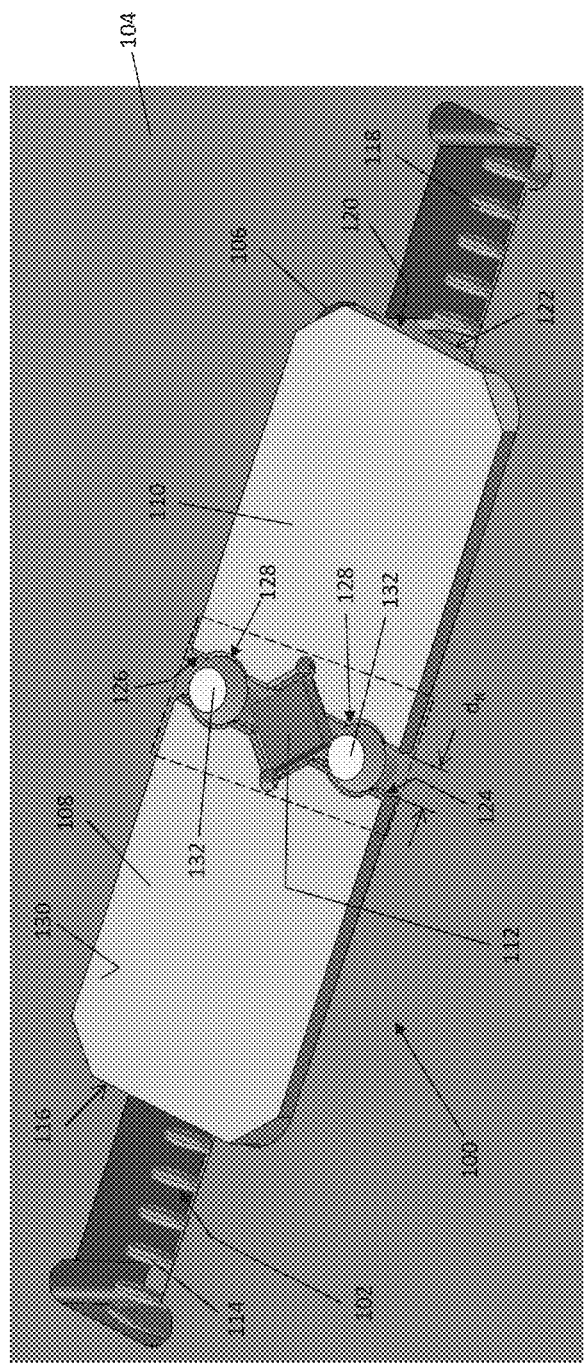
FIGS. 1A and 1B, illustrates different views of an apparatus comprising a nest for holding a semiconductor device and an actuator for moving the nest from a device receiving position to a device aligning position, according to an embodiment.
Figure 1B:
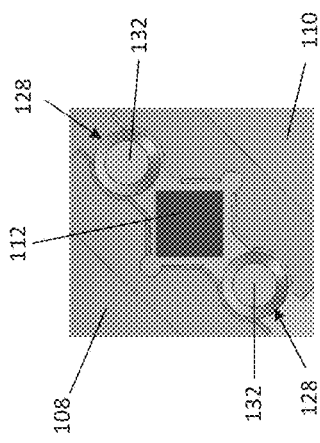

FIG. 1, which includes FIGS. 1A and 1B, illustrates an embodiment of an apparatus that includes a nest 100 and an actuator 102. FIG. 1A shows an angled perspective view of the apparatus, and FIG. 1B shows an enlarged top plan view corresponding to the dashed box in FIG. 1A. The apparatus includes a plate or other structure 104 such as a device carrier (or so-called shuttle) for transporting semiconductor devices, a test socket for testing semiconductor devices, etc., where each receptacle 106 in the plate/structure 104 includes an instance of the nest 100 and the actuator 102.

The nest 100 has a first section 108 and a second section 110. The nest 100 is configured to receive a semiconductor device 112 such as a semiconductor package or semiconductor die (chip) in a receiving position in which the first and second nest sections 108, 110 are spaced apart from one another by a first distance ($d_R$). The nest 100 is further configured to align the semiconductor device 112 in an aligning position in which the first and second nest sections 108, 110 are spaced apart from one another by a second distance ($d_A$) less than the first distance (FIG. 1 shows the nest 100 in the receiving position). The actuator 102 moves the nest 100 from the receiving position to the aligning position.

According to the embodiment shown in FIG. 1, the actuator 102 includes a first spring 114 disposed adjacent and extending away from the outer end 116 of the first nest section 108 and a second spring 118 disposed adjacent and extending away from the outer end 120 of the second section 110. The first and second sections 108, 110 of the nest 100 can be blocks with a cavity 122 at the outer end 116, 120 of each nest section 108, 110 for receiving the corresponding spring 114, 118. The first and second nest sections 108, 110 may be devoid of a cavity for receiving a spring, and instead the corresponding spring 114, 118 can be pressed against the surface of the outer end 116, 120 of the respective section 108, 110. In either case, the inner ends 124, 126 of the first and nest sections 108, 110 are shaped to form the nest 100 for receiving and aligning the semiconductor device 112. For example, the inner end 124 of the first section 108 is designed to contact two sides of the semiconductor device 112 when the actuator 102 moves the nest 100 from the receiving position to the aligning position. The inner end 126 of the second section 110 is likewise designed to contact the other two sides of the semiconductor device 112 when the nest 100 is in the aligning position. FIG. 1 shows the nest 100 in the receiving position, with the first and second nest sections 108, 110 spaced further apart from one another and the device roughly aligned with the nest 100.

The semiconductor device 112 is placed in the nest 100 formed by the two sections 108, 110 via any suitable mechanism such as a pick-up head of a carry device. The semiconductor device 112 is roughly aligned within the nest 100 when the nest 100 is in the receiving position as shown in greater detail in the enlarged view of FIG. 1B. The actuator 102 moves the nest 100 from the receiving position to the aligning position. In the embodiment shown in FIG. 1, each actuator spring 114, 118 is under greater compressive stress in the receiving position than in the aligning position to provide the lateral movement of the nest sections 108, 110. At least one shaft 128 is interposed between the sections 108, 110 of the nest 100 in the receiving position, yielding a larger area to receive the semiconductor device 112. Each shaft 128 is moveable in a direction perpendicular to the main surface 130 of the nest sections 108, 110. Each shaft 128 moves between a first position in which the shaft 128 is interposed between the first and second sections 108, 110 of the nest 100 and a second position in which the shaft 128 is disposed below the nest sections 108, 110. FIG. 1 shows the shafts 128 in the first position. The plate/structure 104 has sufficient open space to accommodate each shaft 128 in the second position. The shafts 128 can be spring-loaded to achieve the vertical motion described above.

When the shafts 128 are moved downward below the sections 108, 110 of the nest 100 by application of an external force, the actuator springs 114, 118 relax and force the nest sections 108, 110 to move toward one another in the lateral direction (i.e. the direction perpendicular to the vertical direction) into the aligning position. In the aligning position, the inner ends 124, 126 of the nest sections 108, 110 contact the sides of the semiconductor device 112 to align the device 112 within the nest 100 by a lateral pressing force. The nest 100 can be moved back to the receiving position after the semiconductor device 112 is aligned so that the device 112 can be easily removed from the nest. The nest 100 is moved from the aligning position to the receiving position by relaxing the external downward force applied to the shafts 128. This in turn allows the shafts 128 to move in the vertical direction from the second position below the sections 108, 110 of the nest 100 back to the first position interposed between the nest sections 108, 110. The ends 132 of the shafts 128 nearest the nest sections 108, 110 can be tapered as shown in FIG. 1 in order to smoothly spread apart the nest sections 108, 110 into the receiving position. In each case, the spring-based actuator 102 acts on the nest sections 108, 110 responsive to vertical movement of the shafts 128.

Figure 2:
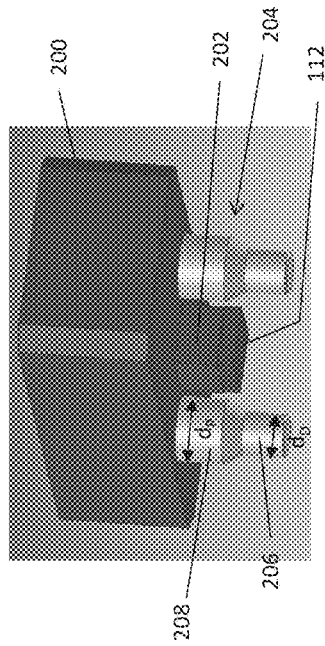
FIG. 2 illustrates a perspective view of an embodiment of a plunger for use with the apparatus of FIG. 1.

FIG. 2 shows an angled perspective view of an embodiment of a plunger 200 for retrieving the semiconductor device 112 from the nest 100 after alignment of the device 112. The plunger 200 is moveable in a direction perpendicular to the main surface 130 of the first and second sections 108, 110 of the nest 100 so that the plunger 200 can place a semiconductor device 112 in the nest 100 for alignment and later remove the device 112 from the nest 100 after alignment. To this end, the plunger 200 includes a pickup-head 202. In one embodiment, the pick-up head 202 forms a vacuum seal with the top surface of the semiconductor device 112 when the pick-up head 202 comes into contact with the device 212.

According to one embodiment, the plunger 200 is the mechanism that moves each shaft 128 between the first and second positions by applying a vertical force to the shafts 128. By applying a downward force to the shafts 128, the plunger 200 forces each shaft 128 into the second position and causes the actuator 102 to move the nest 100 from the receiving position to the aligning position in the lateral direction. By moving the plunger 200 away from the nest 100, each shaft 128 returns to the first position interposed between the nest sections 108, 110 e.g. by spring action.

In one embodiment, the plunger 200 includes a member 204 vertically aligned with one of the shafts 128. Each member 204 has a distal end 206 with a smaller diameter ($d_D$) and a proximal end 208 with a larger diameter ($d_P$). The diameter of the distal end 206 of each member 204 is less than the diameter of the corresponding shaft 128. The plunger 200 presses the distal end 206 of the each member 204 against the corresponding shaft 128 to move the shaft 128 to the second position and interpose the distal end 206 of each member 204 between the first and second sections 108, 110 of the nest 100. The actuator 102 moves the nest 100 from the receiving position to the aligning position responsive to the distal end 204 of the actuator members 204 being interposed between the first and second sections 108, 110 of the nest 100. In the embodiment of FIG. 1, this involves each actuator spring 114, 118 relaxing and thereby pressing the first and second nest sections 108, 110 toward each other to contact the sides of the semiconductor device 112 positioned in the nest 100. The plunger 200 moves the distal end 206 of each member 204 away from the nest 100 in an upward vertical direction after the semiconductor device 112 is aligned in the nest 100 so that each shaft 128 can move back to the first position. This in turn forces the nest 100 to move from the aligning position to the receiving position so that the aligned device 112 can be removed from the nest 100 by the pick-up head 202 of the plunger 200.

FIGS. 3A through 3F illustrate various steps of an embodiment of a method of aligning a semiconductor device 112 using an apparatus comprising the nest 100 and actuator 102 shown in FIG. 1 and the plunger 200 shown in FIG. 2.

In FIG. 3A, a pick-up head carry device 300 positions a semiconductor device 112 over the nest 100 disposed in the receptacle 106 of the plate/structure 104. The nest 100 is in the receiving position at this point, with the first and second nest sections 108, 110 spaced apart at a first distance ($d_R$) by the shafts 128 being interposed between the nest sections 108, 110 and the actuator springs 114, 118 being compressed. The actuator springs are out of view in FIG. 3.

In FIG. 3B, the semiconductor device 112 is seated in the nest 100 which remains in the receiving position.

Figure 3D:
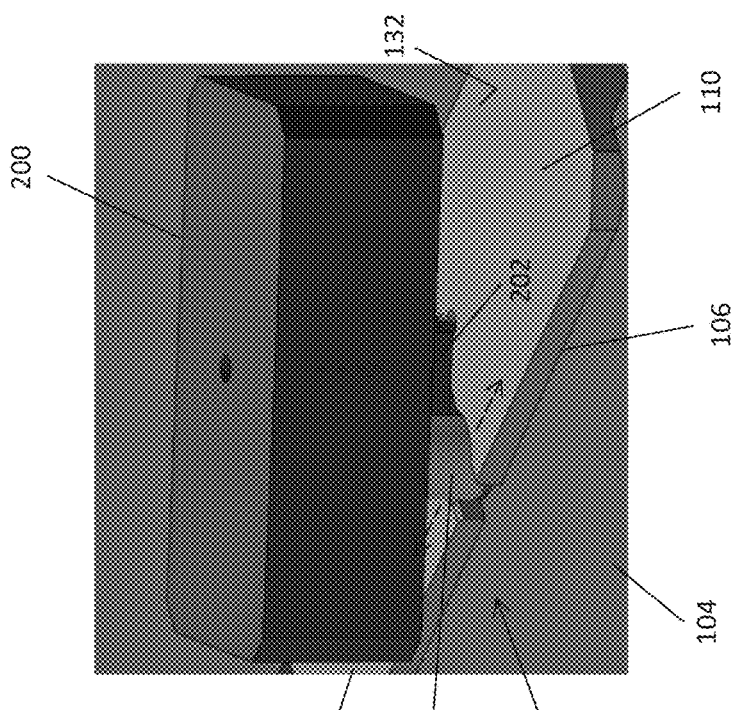
Figure 3C:
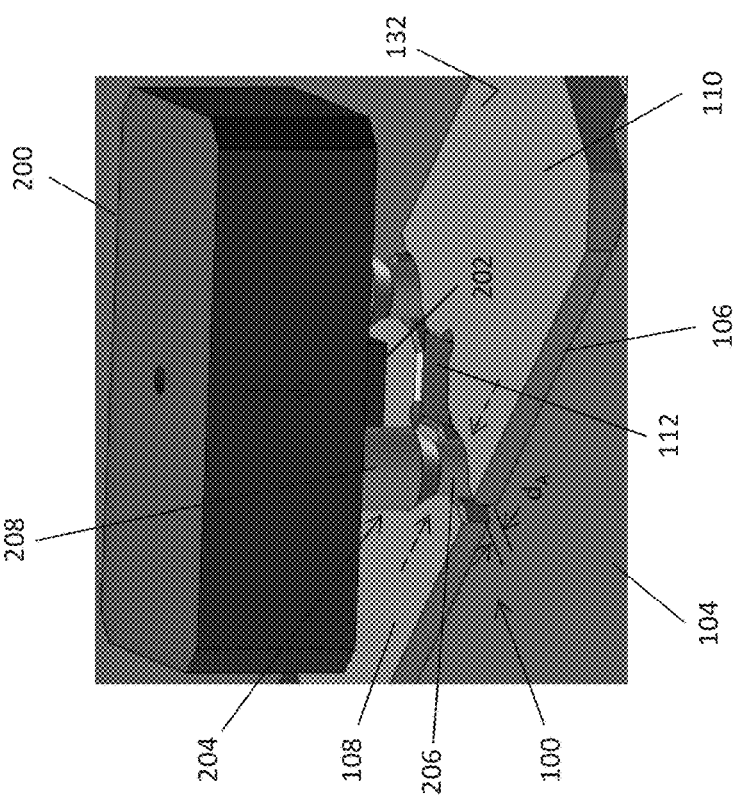

In FIG. 3C, the plunger 200 is moved downward in a direction perpendicular to a main surface 132 of the first and second sections 108, 110 of the nest 100 (as indicated by the downward facing dashed arrow in FIG. 3C) so that the plunger members 204 press against the corresponding shaft 128. In a first phase of the downward pressing by the plunger 200, the shafts 128 are forced below the first and second sections 108, 110 of the nest 100 by the plunger members 204 and the distal ends 206 of the plunger members 204 become interposed between the nest sections 108, 110 instead of the shafts 128. Due to the smaller diameter of the distal end 206 of the plunger members 204 as compared to the shafts 128, the nest 100 is forced into the aligning position by the actuator 102 and the first and second nest sections 108, 110 are spaced apart at a smaller distance ($d_A$). According to the spring-based actuator embodiment of FIG. 1, the compressive force of each actuator spring 114, 118 relaxes to force the corresponding nest section 108, 110 toward the other section in the lateral direction (as indicated by the inward facing dashed lateral arrows in FIG. 3C) to align the semiconductor device 112 within the nest 100 in the aligning position e.g. by the nest sections 108, 110 pressing laterally against the sides of the device 112.

In FIG. 3D, the nest sections 108, 110 are forced apart from one another during a second phase of the downward pressing. In this second phase of the pressing (as indicated by the downward facing dashed arrow in FIG. 3D), the wider proximal ends 208 of the plunger members 204 become interposed between the nest sections 108, 110 instead of the narrower distal ends 206 to force the nest sections 108, 110 apart (as indicated by the outward facing dashed lateral arrows in FIG. 3D). Also during this second phase of pressing, the pick-up head 202 of the plunger 200 forms a vacuum seal with the aligned semiconductor device 112 in the nest 100. The plunger pick-up head 202 can be spring-loaded so that the pick-up head 202 can make contact with the semiconductor device 112 during the first phase of the downward plunger pressing. As the downward pressing continues, the pick-up head 202 retracts by spring action to accommodate the downward movement of the plunger 200 without damaging the semiconductor device 112. A vacuum seal is formed with the semiconductor device 112 after the device 112 is centered within the nest 100 to ensure proper alignment.

Figure 3F:
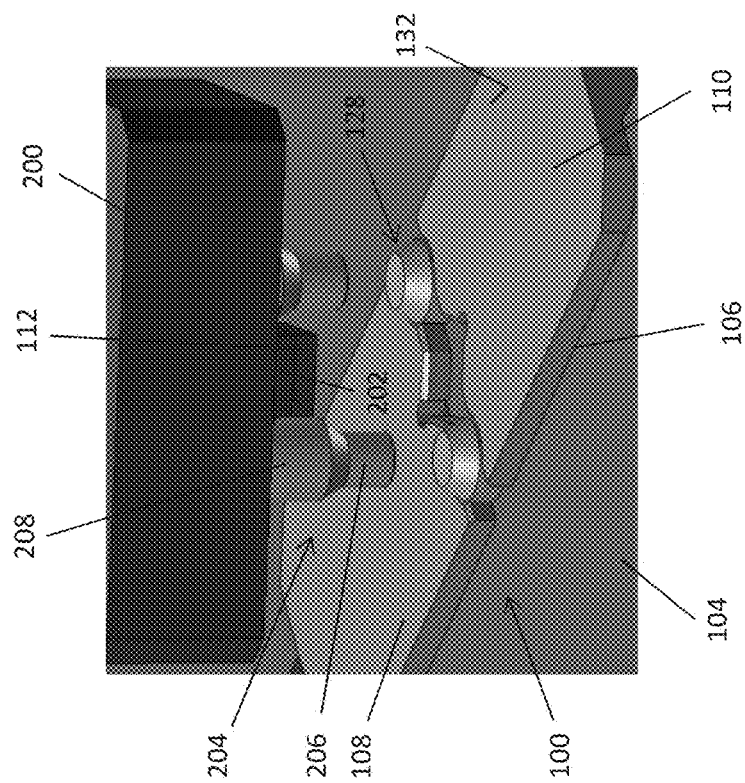
Figure 3E:
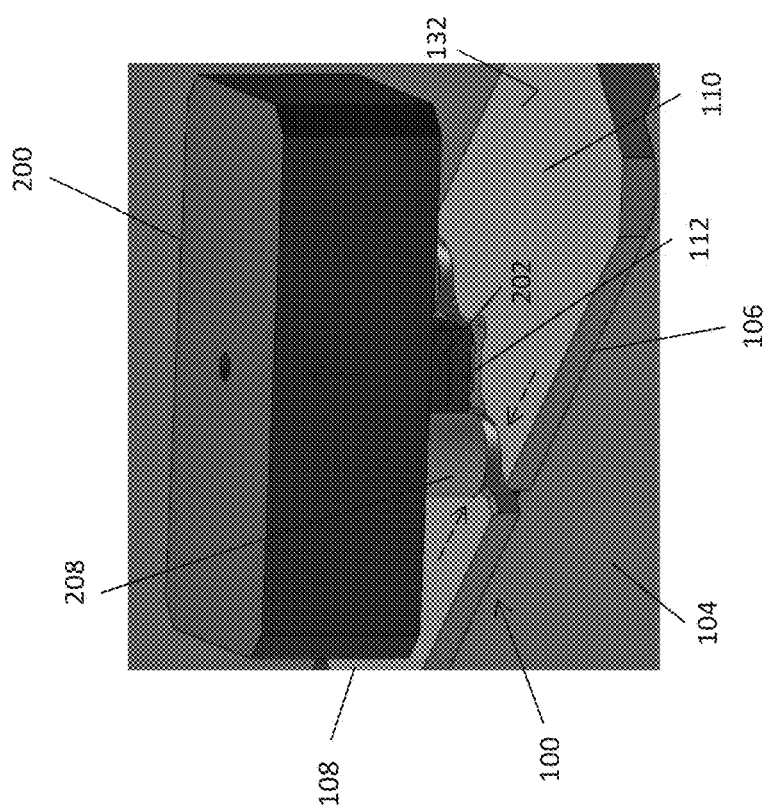

In FIG. 3E, the plunger 200 begins to move away from the nest 100 in the vertical direction (as indicated by the upward facing dashed arrow in FIG. 3E) so that the plunger members 204 permit the shafts 128 to begin returning to their first position. Again due to the smaller diameter of the distal end 206 of the plunger members 204 which are now interposed between the nest sections 108, 110 instead of the wider proximal ends 208, each actuator spring 114, 118 relax and the nest sections 108, 110 move toward one another in the lateral direction (as indicated by the inward facing dashed lateral arrows in FIG. 3E). A vacuum seal is formed between the pick-up head 202 of the plunger 200 and the semiconductor device 112 before the nest 100 closes to ensure a sufficient hold on the device 112.

In FIG. 3F, the plunger 200 is fully retrieved and the nest 100 is returned to the receiving position. The process can be repeated for another semiconductor device.

Figure 4B:
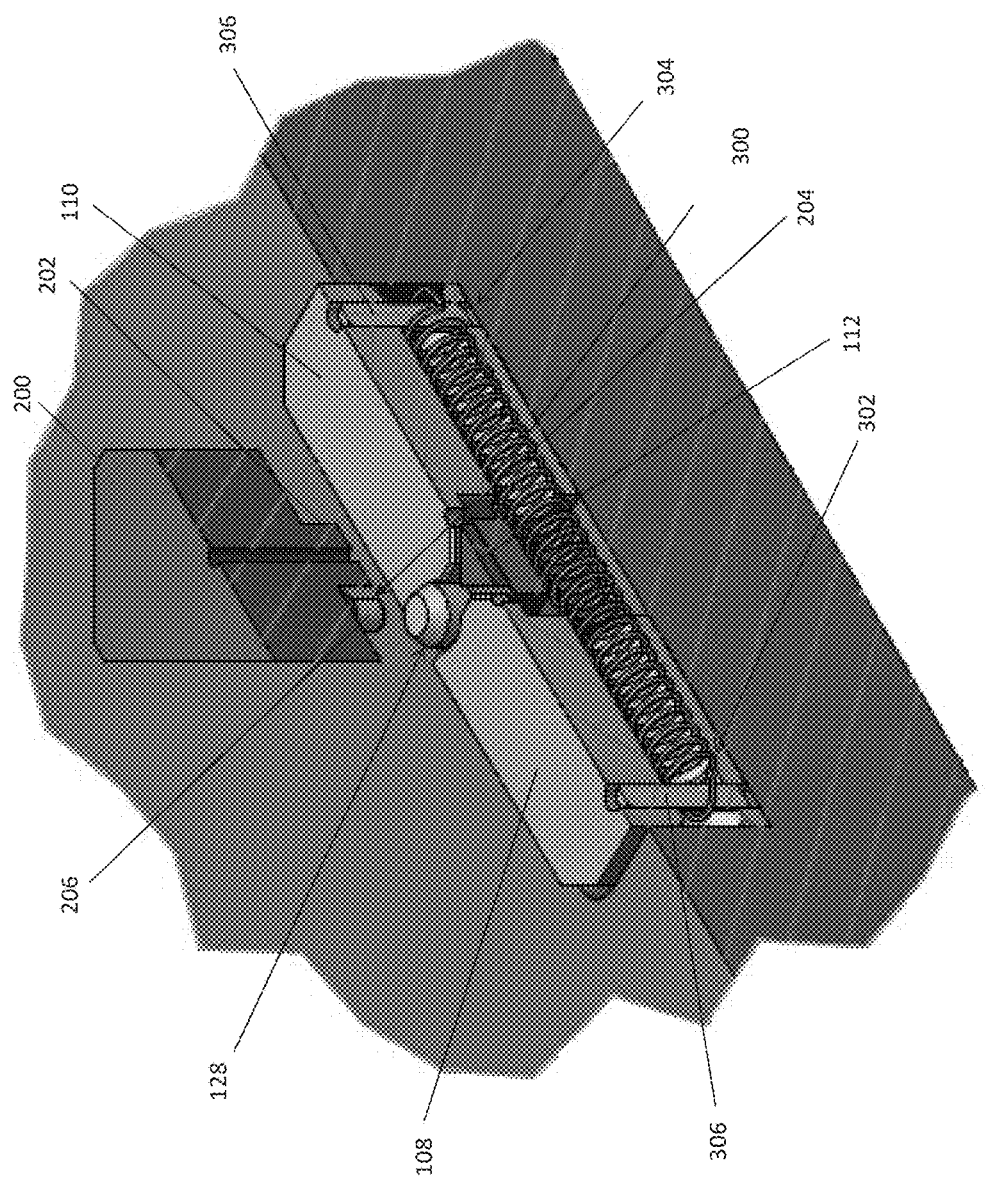

FIG. 4, which includes FIGS. 4A and 4B, illustrates another embodiment of an apparatus that includes a nest 100 and an actuator 102. FIG. 4A shows an angled perspective view of the apparatus, and FIG. 4B shows a cross-sectional view of the apparatus along the line labelled 'K' in FIG. 4A. The apparatus shown in FIG. 4 is similar to the one shown in FIG. 1, however, the actuator 102 comprises a single spring 300 disposed below the nest 100 and having a first end 302 secured to the first section 108 of the nest 100 and a second end 304 secured to the second section 110 of the nest 100. In one embodiment, each end 302, 304 of the spring 302 is secured to the corresponding nest section 108, 110 by a respective pin 306. In the receiving position, the nest sections 108, 110 are spaced further apart from one another than in the aligning position as previously described herein. The spring 300 is under greater tensile stress in the receiving position than in the aligning position. As such, the nest 100 can be moved from the receiving position to the aligning position by reducing the tensile stress of the spring 300. The tensile stress of the spring 300 can be reduced by pressing the shafts 128 from the first position interposed between the nest sections 108, 110 to the second position below the nest sections 108, 110 using the plunger 200 e.g. as illustrated in FIG. 3C and previously described herein. The actuator springs 114, 118, 300 described herein can be coil or leaf springs.

Figures 5A, 5B:
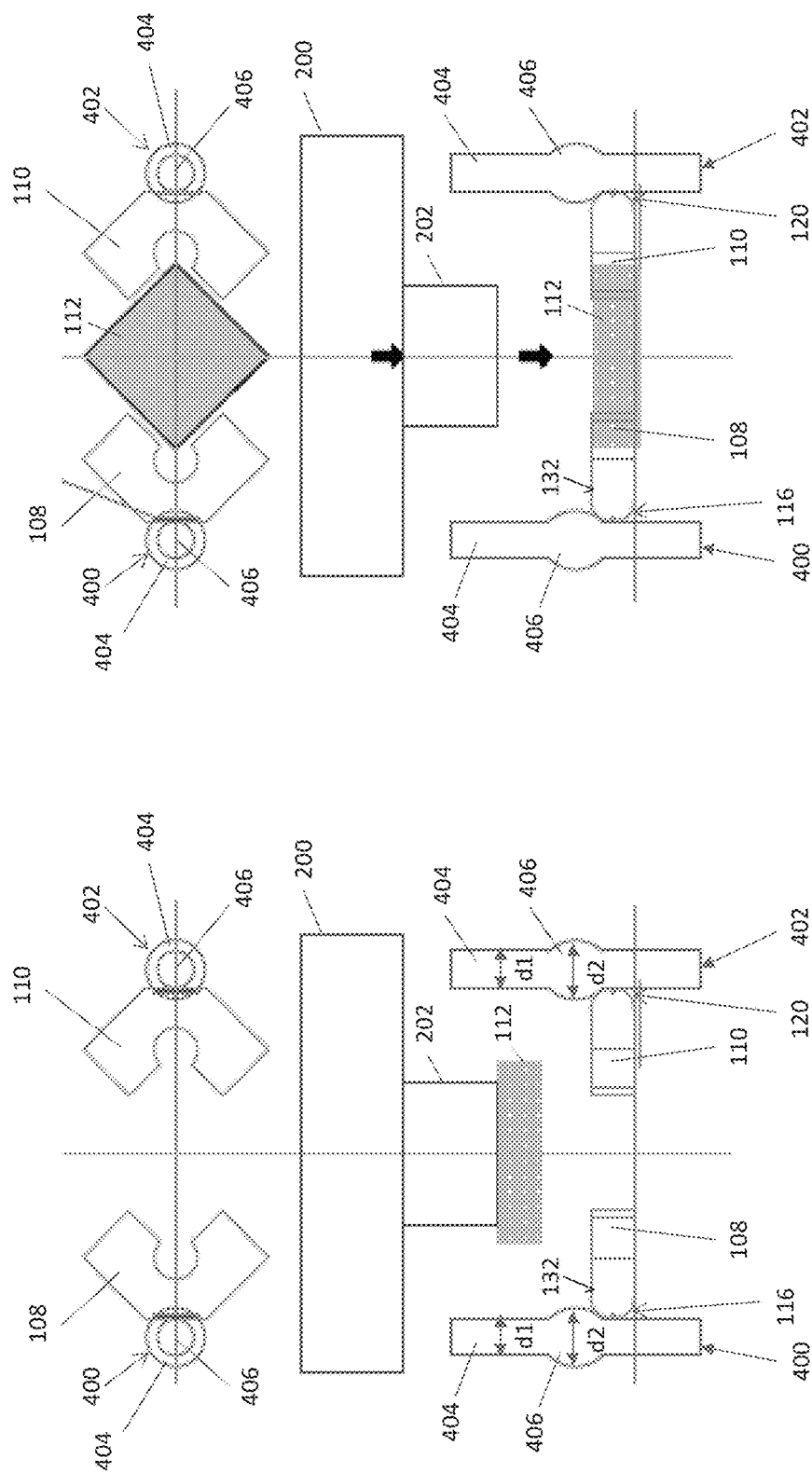
FIGS. 5A through 5E, illustrates a perspective view of yet another embodiment of an apparatus comprising a nest for holding a semiconductor device and an actuator for moving the nest from a device receiving position to a device aligning position during different stages of an embodiment of a method of aligning a semiconductor device within the nest of the apparatus.
Figure 5D:
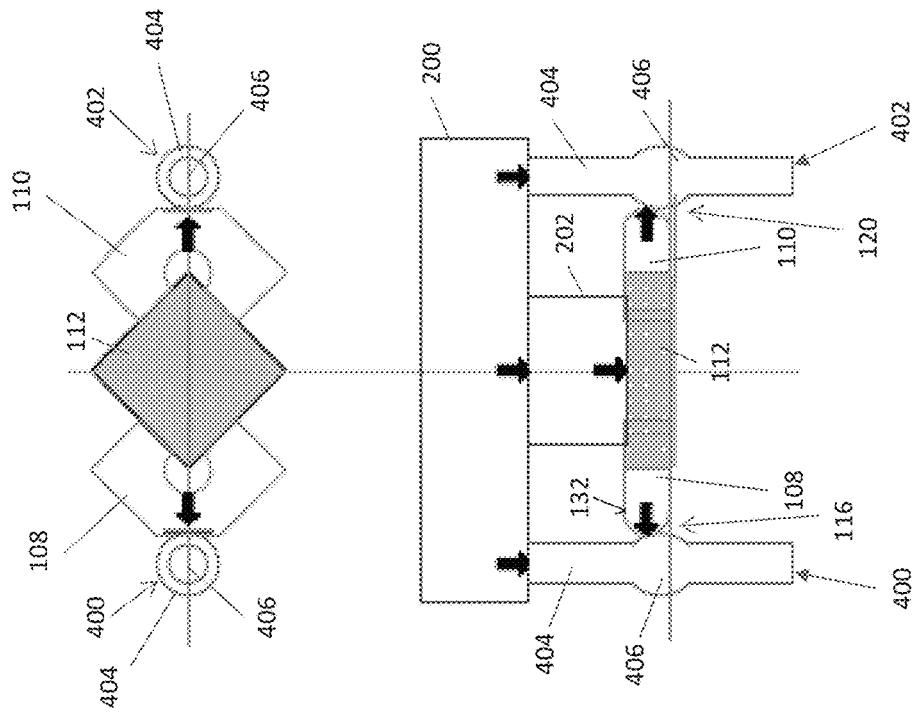
Figure 5C:
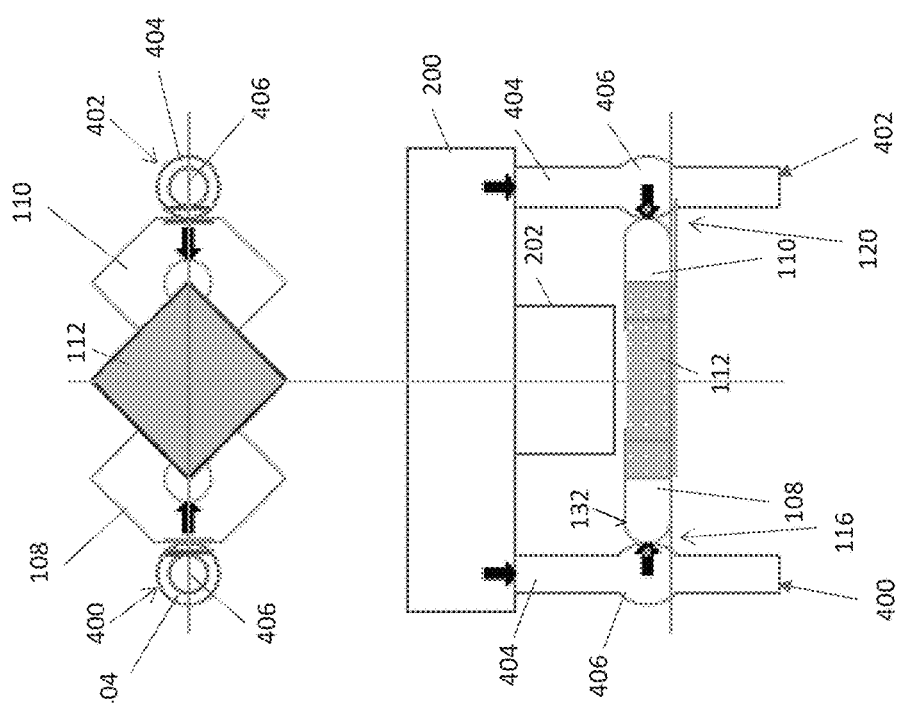
Figure 5E:
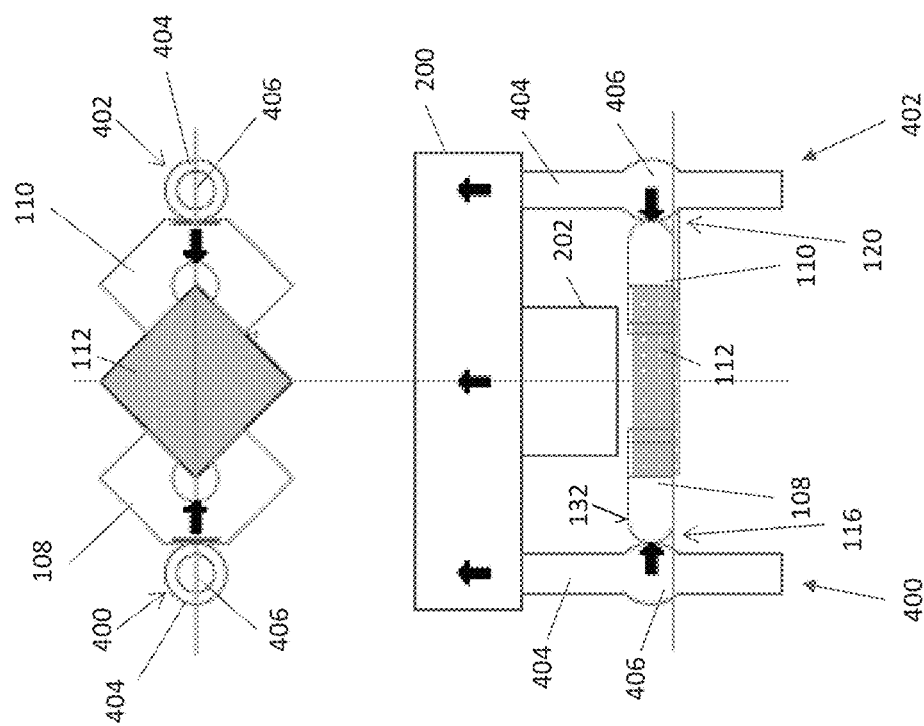

FIG. 5, which includes FIGS. 5A and 5E, illustrates another embodiment of the apparatus that includes a nest 100 and an actuator 102 during various stages of aligning a semiconductor device 112. The bottom part of each of FIGS. 5A and 5E shows a cross-sectional view of the apparatus during a respective stage of the alignment process, and the top part of each of FIGS. 5A and 5E shows a corresponding top plan view of the apparatus. The apparatus shown in FIG. 5 is similar to the one shown in FIG. 1, however, the actuator 102 comprises a first shaft 400 adjacent the outer end 116 of the first section 108 of the nest 100 and a second shaft 402 adjacent the outer end 120 of the second section 110 of the nest 100 as shown in FIG. 5A. Each actuator shaft 400, 402 has a first part 404 with a smaller diameter (d1) and a second part 406 with a larger diameter (d2). Each actuator shaft 400, 402 is moveable in a direction perpendicular to a main surface 132 of the first and second sections 108, 110 of the nest 100 responsive to a force acting on the shafts 402, 404. The external force can be exerted by a plunger 200.

The plunger 200 includes a pick-up head 202 for holding a semiconductor device 112. The semiconductor device 112 is seated within the nest 100 in the receiving position by moving the plunger 200 downward toward the nest 100 as indicated by the downward facing arrows in FIG. 5B. After the semiconductor device 112 is seated in the nest 100, the device 112 can be aligned by further moving the plunger 200 downward as indicated by the downward facing arrows in FIG. 5C. In response to the plunger pressing down on the actuator shafts 400, 402, the actuator 102 moves the nest 100 from the receiving position to the aligning when the second (wider) part 406 of the first shaft 400 contacts the first section 108 of the nest 100 and the second (wider) part 406 of the second shaft 402 contacts the second section 110 of the nest 100. This results in a lateral compressive force being exerted against the nest sections 108, 110 as indicated by the lateral inward facing arrows in FIG. 5C, causing the nest sections 108, 110 to move toward one another and align the semiconductor device 112 by contacting the sides of the device 112.

The plunger 200 can be pressed slightly further downward as indicated by the downward facing arrows in FIG. 5D after the semiconductor device 112 is aligned e.g. to test the device 112 by ensuring sufficient contact with a test socket. This additional slight downward pressing reduces some of the lateral compressive force exerted against the nest sections 108, 110 as indicated by the lateral outward facing arrows in FIG. 5D. The plunger 200 can then be moved upward away from the semiconductor device 112 without forming a vacuum seal with the device 112 e.g. during testing of the device 112 as indicated by the upward facing arrows in FIG. 5E. The wider part 406 of the actuator shafts 400, 402 exert sufficient lateral force against the nest sections 108, 110 to ensure the nest 100 remains in the aligning position sections as indicated by the lateral inward facing arrows in FIG. 5E e.g. during testing. The device 112 can be later removed e.g. from the test socket after completion of testing by moving the plunger 200 downward, forming a vacuum seal with the device 112, and then moving the plunger 200 upward away from the nest 100 with the device 112 vacuum sealed to the pick-up head 202 of the plunger 200.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An apparatus, comprising:
   a nest comprising first and second separate sections, the nest configured to receive a semiconductor device in a receiving position in which the first and second sections are spaced apart from one another by a first distance and to align the semiconductor device in an aligning position in which the first and second sections are spaced apart from one another by a second distance less than the first distance;
   an actuator configured to move the nest from the receiving position to the aligning position; and
   a shaft moveable between a first position in which the shaft is interposed between the first and second sections of the nest and a second position in which the shaft is disposed below the first and second sections of the nest, wherein a plunger separate from the shaft is configured to press against the shaft to move the shaft from the first position to the second position, and wherein the actuator is configured to move the nest from the receiving position to the aligning position responsive to the shaft moving from the first position to the second position.

2. The apparatus of claim 1, wherein the shaft is moveable between the first and second positions in a direction perpendicular to a main surface of the first and second sections responsive to the plunger pressing against the shaft.

3. The apparatus of claim 1, wherein the actuator comprises a spring disposed below the nest and having a first end secured to the first section of the nest and a second end secured to the second section of the nest, and wherein the spring is under greater tensile stress in the receiving position than in the aligning position.

4. The apparatus of claim 1, wherein each of the first and second sections of the nest has a first end facing the other section and a second end facing away from the other section, wherein the actuator comprises a first spring disposed adjacent and extending away from the second end of the first section and a second spring disposed adjacent and extending away from the second end of the second section, and wherein each of the first and second springs is under greater compressive stress in the receiving position than in the aligning position.

5. The apparatus of claim 1, wherein the first section of the nest is shaped to contact first and second sides of the semiconductor device in the aligning position and the second section of the nest is shaped to contact third and fourth sides of the semiconductor device in the aligning position.

6. The apparatus of claim 1, wherein the apparatus is a carrier for transporting semiconductor devices and has a plurality of regions each for receiving a semiconductor device, each region of the carrier having an instance of the nest and the actuator.

7. The apparatus of claim 1, wherein the apparatus is a test socket for testing semiconductor devices and has at least one region for receiving a semiconductor device, each region of the test socket having an instance of the nest and the actuator.

8. A method of aligning a semiconductor device, the method comprising:
   placing a semiconductor device in a nest between first and second separate sections of the nest when the nest is in a receiving position in which the first and second sections are spaced further apart from one another than when the nest is in an aligning position;

moving the nest from the receiving position to the aligning position with the semiconductor device in the nest so that the first and second sections are spaced closer to one another and align the semiconductor device in the nest; and removing the semiconductor device from the nest after the semiconductor device is aligned, wherein moving the nest from the receiving position to the aligning position comprises moving a shaft from a first position in which the shaft is interposed between the first and second sections of the nest to a second position in which the shaft is disposed below the first and second sections of the nest, wherein a plunger separate from the shaft presses against the shaft to move the shaft from the first position to the second position, and wherein an actuator moves the nest from the receiving position to the aligning position responsive to the shaft moving from the first position to the second position.

9. The method of claim 8, wherein moving the shaft from the first position to the second position comprises moving the plunger in a direction perpendicular to a main surface of the first and second sections of the nest so that a member connected to the plunger presses against the shaft and pushes the shaft below the first and second sections of the nest.

10. The method of claim 8, wherein a spring is disposed below the nest and has a first end secured to the first section of the nest and a second end secured to the second section of the nest, the spring being under greater tensile stress in the receiving position than in the aligning position, and wherein moving the nest from the receiving position to the aligning position comprises reducing the tensile stress of the spring.

11. The method of claim 8, wherein each of the first and second sections of the nest has a first end facing the other section and a second end facing away from the other section, wherein a first spring is disposed adjacent and extends outward from the second end of the first section, wherein a second spring is disposed adjacent and extends outward from the second end of the second section, wherein each of the first and second springs is under greater compressive stress in the receiving position than in the aligning position, and wherein moving the nest from the receiving position to the aligning position comprises reducing the compressive stress of the first and second springs.

12. The method of claim 8, wherein removing the semiconductor device from the nest after the semiconductor device is aligned comprises:

moving the nest from the aligning position back to the receiving position by moving the shaft from the second position to the first position; and removing the semiconductor device from the nest via the plunger having a head which forms a vacuum seal with the semiconductor device.

13. The method of claim 12, wherein moving the nest from the aligning position back to the receiving position comprises moving the plunger in a direction perpendicular to a main surface of the first and second sections of the nest so that a member connected to the plunger and which presses the shaft into the first position allows the shaft to return to the second position.

14. An apparatus, comprising:

a nest comprising first and second separate sections, the nest configured to receive a semiconductor device in a receiving position in which the first and second sections are spaced apart from one another by a first distance and to align the semiconductor device in an aligning position in which the first and second sections are spaced apart from one another by a second distance less than the first distance;

an actuator configured to move the nest from the receiving position to the aligning position;

a plunger moveable in a direction perpendicular to a main surface of the first and second sections of the nest so that the plunger can place a semiconductor device in the nest for alignment and remove the semiconductor device from the nest after alignment; and a shaft moveable between a first position in which the shaft is interposed between the first and second sections of the nest and a second position in which the shaft is disposed below the first and second sections of the nest, wherein the plunger is configured to move the shaft between the first and second positions, and wherein the actuator is configured to move the nest from the receiving position to the aligning position responsive to the plunger moving the shaft to the second position.

15. The apparatus of claim 14, wherein the plunger comprises a member having a distal end with a first diameter and a proximal end with a second diameter larger than the first diameter, wherein the first diameter of the distal end of the member is less than a diameter of the shaft, wherein the plunger is configured to press the distal end of the member against the shaft to move the shaft to the second position and interpose the distal end of the member between the first and second sections of the nest, and wherein the actuator is configured to move the nest from the receiving position to the aligning position responsive to the distal end of the member being interposed between the first and second sections of the nest.

16. The apparatus of claim 15, wherein the plunger is configured to move the distal end of the member away from the nest after a semiconductor device is aligned in the nest so that the shaft moves back to the first position, and wherein the nest is configured to move from the aligning position to the receiving position responsive to the distal end of the member being moved away from the nest and the shaft being returned to the first position.

17. The apparatus of claim 15, wherein the actuator comprises a spring disposed below the nest and having a first end secured to the first section of the nest and a second end secured to the second section of the nest, and wherein the spring is under greater tensile stress when the shaft is interposed between the first and second sections of the nest and under less tensile stress when the distal end of the member is interposed between the first and second sections of the nest.

18. The apparatus of claim 15, wherein each of the first and second sections of the nest has a first end facing the other section and a second end facing away from the other section, wherein the actuator comprises a first spring disposed adjacent and extending away from the second end of the first section and a second spring disposed adjacent and extending away from the second end of the second section, and wherein the first and second springs are under greater compressive stress when the shaft is interposed between the first and second sections of the nest and under less compressive stress when the distal end of the member is interposed between the first and second sections of the nest.

* * * * *